United States Patent
Yoshida

(10) Patent No.: US 6,936,921 B2
(45) Date of Patent: Aug. 30, 2005

(54) HIGH-FREQUENCY PACKAGE

(75) Inventor: Katsuyuki Yoshida, Kokubu (JP)

(73) Assignee: Kyocera Corporation, Kyoto (JP)

( * ) Notice: Subject to any disclaimer, the term of this patent is extended or adjusted under 35 U.S.C. 154(b) by 124 days.

(21) Appl. No.: 10/706,307

(22) Filed: Nov. 12, 2003

(65) Prior Publication Data
US 2004/0140550 A1 Jul. 22, 2004

(30) Foreign Application Priority Data
Nov. 11, 2002 (JP) .................................... P2002-326979
Jan. 24, 2003 (JP) .................................... P2003-015994

(51) Int. Cl.[7] .......................... H01L 23/34; H01L 23/12; H01L 29/00
(52) U.S. Cl. ................... 257/728; 257/700; 257/531
(58) Field of Search ................ 257/728, 700, 257/531

(56) References Cited

U.S. PATENT DOCUMENTS 5,903,239 A * 5/1999 Takahashi et al. ... 343/700 MS
6,800,936 B2 * 10/2004 Kosemura et al. .......... 257/748
6,847,275 B2 * 1/2005 Sayanagi et al. ........... 333/247

FOREIGN PATENT DOCUMENTS

JP    2605502    2/1997

* cited by examiner

Primary Examiner—Amir Zarabian
Assistant Examiner—Kiesha Rose
(74) Attorney, Agent, or Firm—Hogan & Hartson LLP

(57) ABSTRACT

A high-frequency package comprises a dielectric substrate, on an upper face of which a mounting portion of a high-frequency circuit component is formed, a first line conductor formed on the upper face for transmitting high-frequency signals, a first coplanar grounding conductor, a second line conductor formed on a lower face, a second coplanar grounding conductor, a through conductor formed inside for connecting the first and second line conductors, a grounding through conductor connecting the first and second coplanar grounding conductors, a metal terminal bonded to the second line conductor, and grounding metal terminals bonded to the second coplanar grounding conductor, wherein a gap between the grounding metal terminals is equal to or less than ½ of a wavelength of high-frequency signals.

7 Claims, 12 Drawing Sheets

HIGH-FREQUENCY PACKAGE

BACKGROUND OF THE INVENTION

1. Field of the Invention

The present invention relates to a high-frequency package for mounting a high-frequency circuit component of a high-frequency semiconductor device, a high-frequency circuit or the like used in a high-frequency waveband.

2. Description of the Related Art

A high-frequency package used for accommodating a high-frequency circuit component of a high-frequency semiconductor device, a high-frequency circuit or the like that operates in a high-frequency waveband such as a MHz band or a GHz band is, for example, a one shown in FIGS. 11A to 11C disclosed in Japanese Patent Publication No. 2605502.

FIGS. 11A to 11C are views showing an example of such a conventional high-frequency package, FIG. 11A is a plan view showing by cutting away, FIG. 11B is a sectional view taken on line I—I of FIG. 11A, and FIG. 11C is a bottom view. Moreover, FIG. 12 is a perspective view showing by magnifying an essential portion of the high-frequency package shown in FIGS. 11A to 11C. In these views, reference numeral 1 denotes a package substrate made of ceramics or the like, and reference numeral 2 denotes a package side wall made of ceramics or ceramics with a surface metalized, which is mounted on the surface of the package substrate 1. The upper end face of the package side wall 2 that is not in contact with the package substrate 1 is sealed by a lid 3 made of metal such as gold or alloy such as iron-nickel-cobalt alloy. Reference numeral 4 denotes a die bonding region made by applying metalization 5 to the surface of the package substrate 1, reference numeral 6 denotes a dielectric substrate made of ceramics or the like, an internal high-frequency transmission line 19 made by a metal thin film is formed on the surface of the dielectric substrate 6, and the die bonding region 4, the dielectric substrate 6 and the internal high-frequency transmission line 19 are constituted in a cavity surrounded by the package substrate 1, the package side wall 2 and the lid 3. Moreover, a grounding metal thin film 8 and a signal line metal thin film 9 are formed on the bottom portion of the package substrate 1, an external coplanar line 10 is constituted by them, and the signal line metal thin film 9 is structured so as to be electrically connected to the internal high-frequency transmission line 19 by a via hole 11 made of metal.

Reference numeral 18 denotes a grounding metal thin film formed on the surface of the dielectric substrate 6, which constitutes an internal coplanar line 20 together with the internal high-frequency transmission line 19. Moreover, reference numeral 12 denotes a grounding via hole that electrically connects the grounding metal thin film 8 of the external coplanar line 10 and the grounding metal thin film 18 of the internal coplanar line 20.

As shown by a sectional view in FIG. 13, this high-frequency package is surface-mounted on a circuit board 13 made of glass epoxy, fluorine resin, ceramics or the like, and a high-frequency circuit is constituted.

Since the conventional high-frequency package is constituted as described above, there is a problem that when this high-frequency package is surface-mounted on the circuit board 13, a ground network path between the grounding metal thin films 8 becomes long, an inductance component increases, and therefore, a grounding state of the grounding metal thin films 8 tends to become unstable in a bonding region between the package substrate 1 and the circuit board 13 in a case where a gap between the grounding metal thin films 8 placed on both the sides of the signal line metal thin film 9 is longer than one half of a wavelength of used high-frequency signals, with the result that characteristic impedance changes and a reflection loss of high-frequency signals is caused locally in this region, a shield effect of high-frequency signals becomes insufficient and a radiation loss is caused in this region, and therefore, a transmission characteristic of high-frequency signals is deteriorated by these losses.

Furthermore, since the conventional high-frequency package is constituted as described above, there is a problem that when this high-frequency package is surface-mounted on the circuit board 13, because of generation of a stray capacitance component inside the package substrate 1 existing between the signal line metal thin film 9 and the grounding metal thin films 18, 8 and a stray capacitance component inside a dielectric substrate of the circuit board 13 existing between the signal line metal thin film 9 and a lower-face-side grounding conductor (not shown in the drawings) of the circuit board 13 when this high-frequency package is surface-mounted on the circuit board 13, a capacitance component existing between the package substrate 1 and the circuit board 13 increases, with the result that high-frequency mismatching is caused at input/output portions of the high-frequency package at the time of surface-mounting on the circuit board 13, the loss of high-frequency input/output signals increases and a voltage standing wave ratio (abbreviated as VSWR hereafter) deteriorates.

Besides, the conventional high-frequency package has a problem that when this high-frequency package is surface-mounted on the circuit board 13, because a grounding conductor that electrically connects the grounding metal thin film 18 on the upper face of the package substrate 1 and the grounding metal thin film 8 on the lower face is not disposed, the grounding metal thin film 18 and the grounding metal thin film 8 are not in high-frequency connection, and therefore, a grounding state becomes unstable, with the result that the loss of high-frequency input/output signals increases at the input/output portions of the package substrate 1 and a VSWR tends to deteriorate. Moreover, there is a problem that since a propagation mode of high-frequency signals becomes discontinuous at the input/output portions of the package substrate 1, a radiation loss increases, and consequently, a transmission characteristic of high-frequency signals at the input/output portions of the high-frequency package deteriorates.

SUMMARY OF THE INVENTION

The invention was made in order to solve these problems, and an object thereof is to provide a low-loss and low-VSWR high-frequency package that deters high-frequency mismatching to high-frequency input/output signals and a radiation loss at input/output portions when surface-mounted on a circuit board.

The invention provides a high-frequency package comprising: a dielectric substrate, on one face of which a mounting portion of a high-frequency circuit component is formed; a first line conductor, formed on the one face of the dielectric substrate from a vicinity of the mounting portion in an outer periphery direction, for transmitting high-frequency signals; a first coplanar grounding conductor formed on both sides of the first line conductor on the one face of the dielectric substrate; a second line conductor, formed on another face of the dielectric substrate toward an outer periphery edge so that an end portion thereof faces an outer-periphery-side end portion of the first line conductor, for transmitting the high-frequency signals; a second coplanar grounding conductor formed on both sides of the second line conductor on the other face of dielectric substrate; a through conductor, formed inside the dielectric substrate, for electrically connecting the facing end portions of the first and second line conductors; a grounding through conductor, formed inside the dielectric substrate, for electrically connecting the first and second coplanar grounding conductors; a metal terminal bonded to the second line conductor in parallel; and grounding metal terminals bonded to the second coplanar grounding conductors on both sides of the metal terminal in parallel, respectively, wherein a gap between the grounding metal terminals is equal to or less than one half of a wavelength of the high-frequency signals.

Further, in the invention it is preferable that a conductor non-formed portion is disposed on a region in the first coplanar grounding conductor corresponding to a position of the metal terminal.

Further, in the invention it is preferable that a castellation grounding conductor that electrically connects the first coplanar grounding conductor and the grounding metal terminal is disposed on a region in a side face of the dielectric substrate corresponding to a position of the grounding metal terminal.

According to the invention, since a gap between the grounding metal terminals placed on both the sides of the metal terminal in parallel is equal to or less than one half of a wavelength $\lambda$ (i.e., $\lambda/2$) of high-frequency signals of a used frequency in a high-frequency package of the above constitution, a ground network path between the grounding metal terminals becomes short when this high-frequency package is surface-mounted on a circuit board, increase of an inductance component can be prevented. Therefore, it is possible to bring the grounding metal terminals into a stable grounding state at bonding regions between the dielectric substrate of the package and a circuit board on which this high-frequency package is mounted and suppress a leak of high-frequency signals at these regions. As a result, it is possible to deter high-frequency mismatching to high-frequency input/output signals and a radiation loss at input/output portions at the time of surface-mounting on a circuit board, hold down a loss of high-frequency input/output signals and lower a VSWR.

According to the invention, a high-frequency package having an excellent high-frequency signal input/output characteristic that is capable of deterring high-frequency mismatching to high-frequency input/output signals and a radiation loss at input/output portions when surface-mounted on a circuit board, holding down the loss of high-frequency input/output signals and lowering a VSWR is realized.

Thus, according to the invention, it is possible to provide a low-loss and low-VSWR high-frequency package that deters high-frequency mismatching to high-frequency input/output signals and a radiation loss at input/output portions when surface-mounted on a circuit board.

According to the invention, by disposing the conductor non-formed portion on the region in the first coplanar grounding conductor corresponding to the position of the metal terminal, it is possible to decrease a capacitance component inside the dielectric substrate existing between the metal terminal and the first and second coplanar grounding conductors and a capacitance component inside a dielectric substrate of a circuit board existing between the metal terminal and the other face side grounding conductor of the circuit board at the time of surface-mounting this high-frequency package in accordance with the size of the non-formed portion. Therefore, it is possible to reduce a capacitance component generated between the dielectric substrate constituting the high-frequency package and the dielectric substrate of the circuit board that this package is surface-mounted. As a result, it is possible to deter high-frequency mismatching to high-frequency input/output signals and a radiation loss at the input/output portions at the time of surface-mounting on the circuit board, hold down a loss of high-frequency input/output signals and lower a VSWR.

According to the invention, by disposing the castellation grounding conductor that electrically connects the first coplanar grounding conductor and the grounding metal terminal on the region in the side face of the dielectric substrate corresponding to the position of the grounding metal terminal, the first coplanar grounding conductor and the grounding metal terminal are electrically connected directly. Therefore, a grounding state of the input/output portions is stabilized, and it is possible to decrease a reflection characteristic as well as it is possible to increase an electromagnetic wave shield effect and suppress a radiation loss. As a result, it is possible to hold down the loss of high-frequency input/output signals at the high-frequency signal input/output portions and lower a VSWR, and it is possible to obtain a good high-frequency signals transmission characteristic.

In the invention it is preferable that a width of the non-formed portion is equal to a width between the grounding metal terminals.

In the invention it is preferable that a width of the non-formed portion is equal to or less than 80% of a width between the grounding metal terminals.

In the invention it is preferable that a shape of the non-formed portion is a circle or an oval.

In the invention it is preferable that the metal terminal is placed on a side of an outer periphery of the dielectric substrate.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
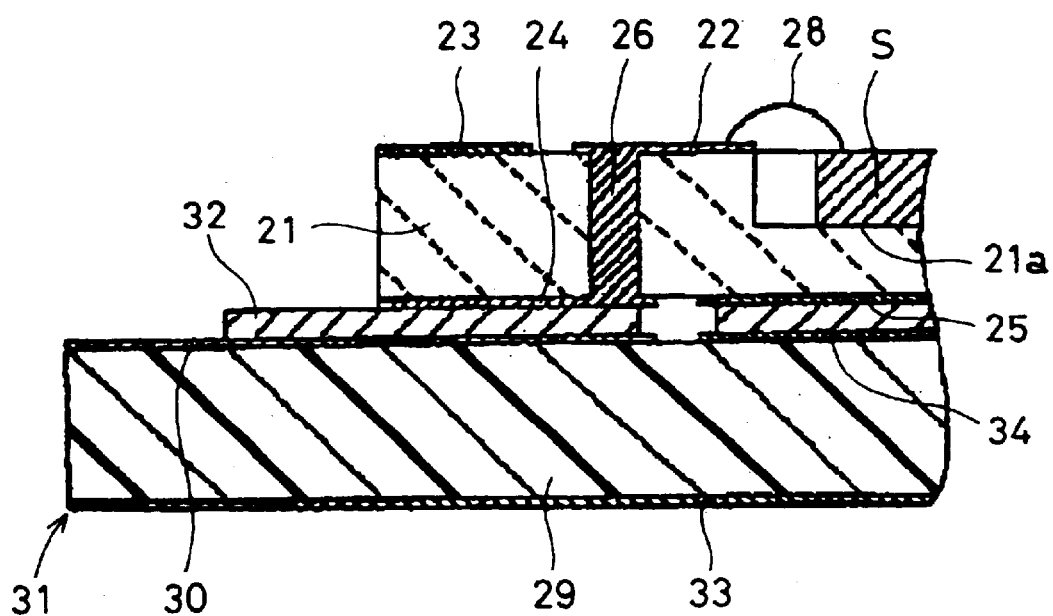
FIG. 1 is a partial sectional view showing a high-frequency package according to an embodiment of the invention.

Now referring to the drawings, preferred embodiments of the invention are described below.

Figure 2:
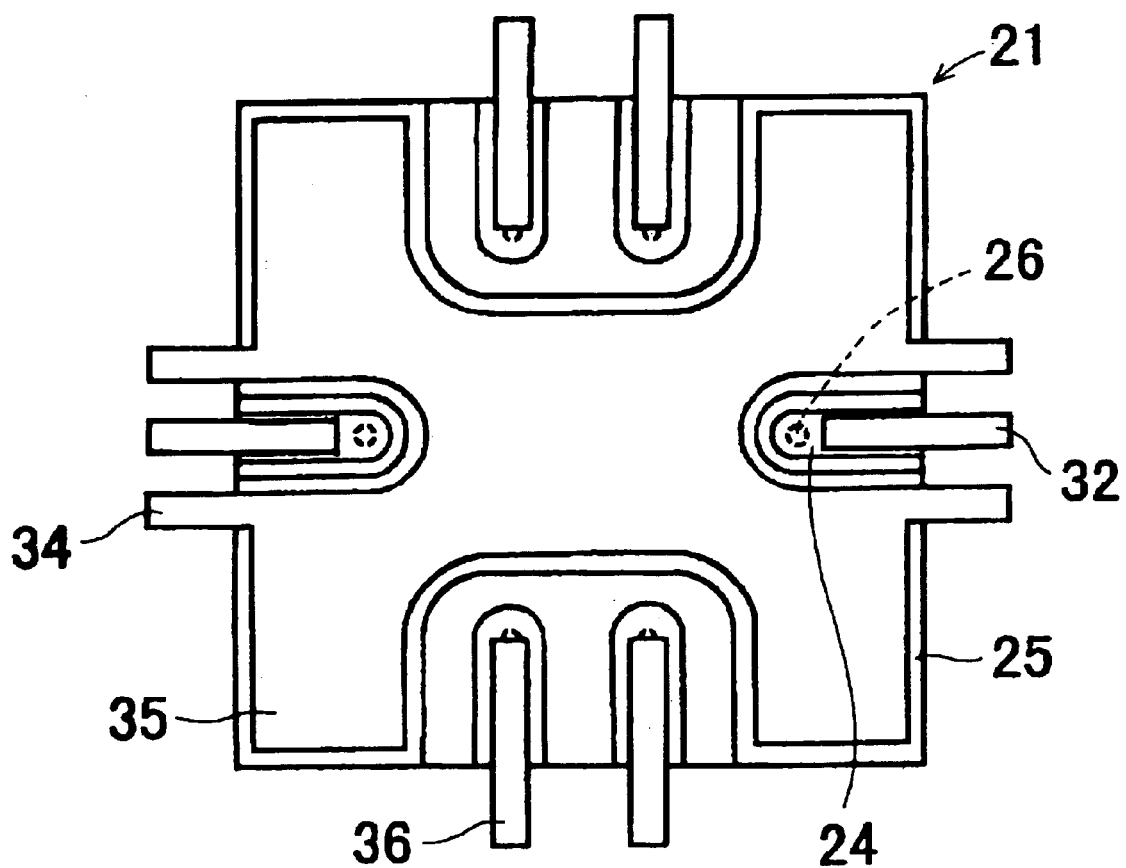
FIG. 2 is a bottom view showing the high-frequency package according to the embodiment of the invention.
Figure 3:
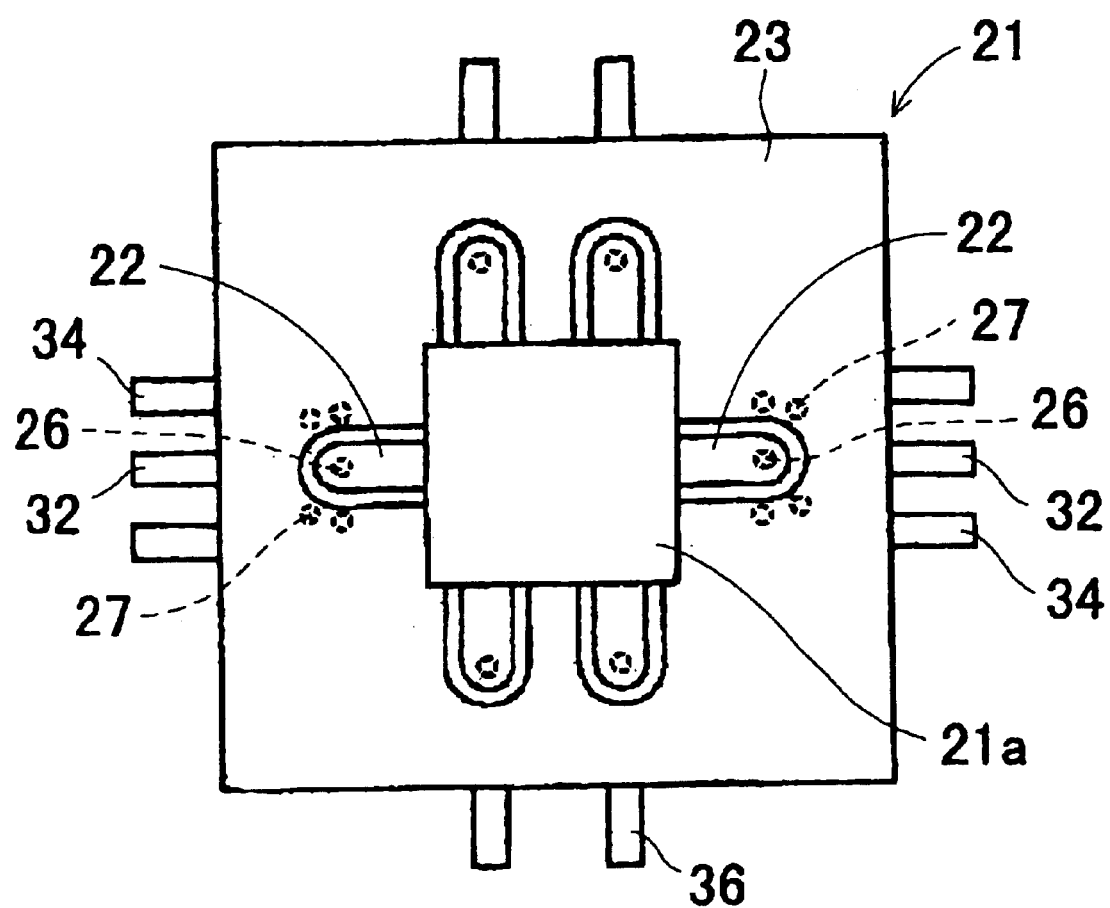
FIG. 3 is a top view showing the high-frequency package according to the embodiment of the invention.

FIGS. 1 to 3 are views showing a high-frequency package according to an embodiment of the invention, FIG. 1 is a partial sectional view showing, FIG. 2 is a bottom view, and FIG. 3 is a top view.

In these views, reference numeral 21 denotes a dielectric substrate, reference numeral 21a denotes a mounting portion on which a high-frequency circuit component S of a high-frequency semiconductor device or the like is mounted, reference numeral 22 denotes a first line conductor, reference numeral 23 denotes a first coplanar grounding conductor, reference numeral 24 denotes a second line conductor, reference numeral 25 denotes a second coplanar grounding conductor, reference numeral 26 denotes a through conductor, reference numeral 27 denotes a grounding through conductor, reference numeral 32 denotes a metal terminal, reference numeral 34 denotes a grounding metal terminal, and a high-frequency package is constituted by them. Moreover, reference numeral 28 denotes a conductive connecting member such as a bonding wire that connects the high-frequency circuit component S and the first line conductor 22.

Further, reference numeral 29 denotes a dielectric base, reference numeral 30 denotes a connecting line conductor, a circuit board 31 is constituted by them, and by connecting the second line conductor 24 of the high-frequency package and the connecting line conductor 30 of the circuit board 31 so as to sandwich the metal terminal 32, the high-frequency package is mounted on the circuit board 31. In addition, this embodiment shows an example of forming a lower-face-side grounding conductor 33 as another grounding conductor on a lower face as another face of the dielectric base 29, forming an upper-face-side grounding conductor 34 as one face-side grounding conductor on the upper face as one face, and electrically connecting the upper-face-side grounding conductor 34 and the second coplanar grounding conductor 25.

Further, although a concavity is formed in the central portion of the upper face of the dielectric substrate 21 and the mounting portion 21a is disposed in the concavity in this embodiment, the mounting portion 21a may be formed on the upper face of the dielectric substrate 21 formed into a flat board.

The dielectric substrate 21 is a supporting body for supporting the high-frequency circuit component S, made of an inorganic dielectric material such as sintered aluminum oxide., sintered aluminum nitride, sintered mullite, sintered silicon carbide, sintered silicon nitride or glass ceramics, an organic dielectric material such as polyimide or glass epoxy, a composite dielectric material made by bonding inorganic dielectric powder such as ceramics powder by a thermosetting resin such as an epoxy resin, or the like, and in this embodiment, formed into a substantially square shape that has a concavity for accommodating the high-frequency circuit component S in the central portion of the upper face. Then, the mounting portion 21a for mounting the high-frequency circuit component S is formed on the bottom face of the concavity, and to this mounting portion 21a, the high-frequency circuit component S is adhered and fixed via an adhesive such as a brazing material, a resin or glass. In addition, on the mounting portion 21a, a metalization layer is formed on the surface of the dielectric substrate 21 as necessary.

For example, in a case where this dielectric substrate 21 is made of sintered aluminum oxide, it is manufactured by: adding and mixing a proper organic binder, solvent, plasticizer, dispersing agent and so on into powder material of aluminum oxide, silicon oxide, calcium oxide or the like and forming into slurry, and forming this into a ceramic green sheet by adopting a sheet forming method such as a doctor blade method; and thereafter, applying a suitable punching process to the green sheet and laminating in plural numbers, and firing at a temperature of approximately 1600° C. in a reduction atmosphere.

Regarding the dielectric substrate 21, the first line conductor 22 that has a width of approximately 0.1 to 1.0 mm is formed on the upper face partway from a vicinity of the mounting portion 21a in the outer periphery direction, the second line conductor 24 that has a width of approximately 0.1 to 1.5 mm is formed so that an end portion thereof faces an outer-periphery-side end portion of the first line conductor 22 in parallel with the first line conductor 22 from the facing region toward the outer periphery edge on the lower face, and the through conductor 26 that electrically connects the end portion of the first line conductor 22 and the end portion of the second line conductor 24 is disposed inside. The first and second line conductors 22, 24 and the through conductor 26 function as a conductive path for electrically connecting each electrode of the high-frequency circuit component S to an external electrical circuit.

The widths of the first and second line conductors 22, 24 are set properly based on the frequency of propagated high-frequency signals and the size of the high-frequency package. In the high-frequency package of the invention, for example, when the dielectric constant of the dielectric substrate 21 is 6, the width of the first line conductor 22 is set to approximately 0.32 mm, and the width of the second line conductor 24 is set to approximately 0.32 mm.

Further, regarding the dielectric substrate 21, the first coplanar grounding conductor 23 is formed on both sides of the first line conductor 22 on the upper face, the second coplanar grounding conductor 25 is formed on both sides of the second line conductor 24 on the lower face, and the grounding through conductor 27 that electrically connects the first coplanar grounding conductor 23 and the second coplanar grounding conductor 25 is disposed inside. The first coplanar grounding conductor 23 and the second coplanar grounding conductor 25 have functions of compensating discontinuity between the first line conductor 22 and the conductive connecting member 28 and increasing isolation between the first line conductor 22 and the second line conductor 24. Moreover, the grounding through conductor 27 is capable of compensating a capacity component for the through conductor 26 of high impedance, and it is possible to prevent mismatching of impedance in the through conductor 26. As a result, it is possible to effectively control mismatching of impedance in electrical connection between the high-frequency circuit component S and the external electric circuit and control deterioration of a high-frequency signal transmission characteristic, and it is possible to realize a high-frequency package of low reflection loss.

Further, by placing the grounding through conductor 27 that electrically connects the first coplanar grounding conductor 23 and the second coplanar grounding conductor 25 in plural numbers with respect to the through conductor 26 that electrically connects the first line conductor 22 and the second line conductor 24 so as to constitute an artificial coaxial structure, it is possible to transfer high-frequency input/output signals between the first line conductor 22 and the second line conductor 24 with small mismatching, with a low loss and at a low VSWR.

Furthermore, in this embodiment, the first coplanar grounding conductor 23 and the second coplanar grounding conductor 25 are continuously and integrally formed so as to respectively surround the facing end portions of the first line conductor 22 and the second line conductor 24, whereby it is possible to obtain a better grounding state.

The first and second line conductors 22, 24, the through conductor 26, the first and second coplanar grounding conductors 23, 25 and the grounding through conductor 27 are made of a conductive material such as metallic metalization of tungsten, molybdenum, copper, silver or the like. For example, in a case where they are made of tungsten metalization, by print-applying or filling tungsten paste prepared by adding and mixing a proper organic binder and solvent to tungsten powder to a ceramic green sheet to become the dielectric substrate 21 on which a through hole to become the through conductor 26 or the grounding through conductor 27 is previously pierced by a screen printing method in a specified pattern, and firing this together with the ceramic green sheet to become the dielectric substrate 21, they are adhered and formed from the upper face to the lower face of the dielectric substrate 1 in a specified pattern.

Regarding the first and second line conductors 22, 24 and the first and second coplanar grounding conductors 23, 25, by disposing metal such as nickel or gold that is excellent in corrosion resistance and excellent in bondability to a connecting member such as a brazing material or a bonding wire on the exposed surfaces thereof to thickness of 1 to 20 $\mu$m, it is possible to effectively prevent oxidation corrosion of the line conductors 22, 24 and the coplanar grounding conductors 23, 25, and it is possible to connect the line conductors 22, 24 and the coplanar grounding conductors 23, 25 to a bonding wire, solder or the like firmly and easily. Therefore, it is preferable to dispose metal such as nickel or gold that is excellent in corrosion resistance on the exposed surface of each conductor of the first and second line conductors 22, 24 and the first and second coplanar grounding conductors 23, 25 by a plating method to thickness of 1 to 20 $\mu$m.

Then, by electrically connecting the high-frequency circuit component S mounted on the mounting portion 21a to the first line conductor 22 by the conductive connecting member 28 and mounting a lid body (not shown in the drawings) on the upper face of the mounting portion 21a to hermetically seal the high-frequency circuit component S, and thereafter, electrically connecting this high-frequency package to the circuit board 31 that the connecting line conductor 30 for transmitting high-frequency signals is formed on the upper face of the dielectric base 29 so as to make the second line conductor 24 and the connecting line conductor 30 face in parallel and so as to sandwich the metal terminal 32 bonded to the second line conductor 24 and placed on the outer periphery edge of the dielectric substrate 21, the high-frequency circuit component inside the high-frequency package and the external electric circuit of the circuit board 31 are electrically connected.

Then, in the high-frequency package of the invention, a gap between the grounding metal terminals 34 placed on both the sides of the metal terminal 32 is equal to or less than one half of a wavelength $\lambda$ (i.e., $\lambda/2$) of high-frequency-signals of a used frequency.

Since a gap between the grounding metal terminals 34 is thus set to $\lambda/2$ or less, a ground network path between the grounding metal terminals 34 becomes short when this high-frequency package is surface-mounted on the circuit board 31, and increase of an inductance component can be prevented. Therefore, the grounding metal terminals 34 can be in a stable grounding state at bonding regions between the dielectric substrate 21 of the high-frequency package and the circuit board 31, and it is possible to suppress a leak of high-frequency signals in these regions. As a result, according to the high-frequency package of the invention, it is possible to deter high-frequency mismatching to high-frequency input/output signals and a radiation loss at input/output portions at the time of surface-mounting on the circuit board 31, hold down the loss of high-frequency input/output signals and lower a VSWR.

In the high-frequency package of the invention, the dielectric substrate 21 is made of an inorganic dielectric material such as sintered aluminum oxide, sintered aluminum nitride, sintered mullite, sintered silicon carbide, sintered silicon nitride or glass ceramics, an organic dielectric material such as polytetrafluoroethylene (PTFE), epoxy, polyimide or glass epoxy, a composite dielectric material made by bonding inorganic dielectric powder such as ceramics powder by a thermosetting resin such as an epoxy resin, or the like, and in this embodiment. The dielectric substrate 21 is formed by laminating a plurality of dielectric layers, if required.

Then, in order to electrically connect the high-frequency circuit component S mounted on the mounting portion 21a to the first line conductor 22 by the conductive connecting member 28 such as a bonding wire and hermetically seal, for example, a lid body (not shown in the drawings) is mounted on the upper face of the mounting portion 21a. As this lid body, a metal material such as Fe—Ni-base alloy like Fe—Ni—Co alloy or Fe—Ni42 alloy, oxygen free copper, aluminum, stainless steel, Cu—W alloy or Cu—Mo alloy, an inorganic material such as sintered aluminum oxide or glass ceramics, a resin material such as PTFE or glass epoxy, or the like is used. Moreover, the lid body is mounted by, depending on a material thereof, a low-melting metal brazing material such as solder or Au—Sn solder, a high-melting metal brazing material such as Au—Ge solder, a resin adhesive such as epoxy or conductive epoxy, welding such as seam welding or electron beam welding, or the like.

The first and second line conductors 22, 24, the through conductor 26, the first and second coplanar grounding conductors 23, 25 and the grounding through conductor 27 are formed by the use of a metal material for a high-frequency line conductor, e.g., a metal thin film, metal foil, metal plate or metalization conductor of Cu, MoMn+Ni+Au (a lamination of MoMn, Ni, and Au layers), W+Ni+Au (a lamination of W, Ni, and Au layers), Cr+Cu (a lamination of Cr and Cu layers), Cr+Cu+Ni+Au (a lamination of Cr, Cu, Ni and Au layers), $Ta_2N$+NiCr+Au (a lamination of $Ta_2N$, NiCr and Au layers), Ti+Pd+Au (a lamination of Ti, Pd and Au layers), NiCr+Pd+Au (a lamination of NiCr, Pd and Au layers) or the like, by a thick film printing method, various kinds of thin film forming methods, a plating method or the like. The thickness, shape and line width thereof and a gap between the line conductor and the coplanar grounding conductor are set appropriately depending on the frequency of high-frequency input/output signals transmitted by the line conductors 22, 24 and the through conductors 26, characteristic impedance or the like. In the high-frequency package of the invention, for example, in a case where a dielectric constant of the dielectric substrate 21 is 6, the width of the first line conductor 22 is set to approximately 0.32 mm, the width of the second line conductor 24 is set to approximately 0.32 mm, the diameter of the through conductor 26 is set to approximately Φ0.15 mm, a gap between the first line conductor 22 and the first coplanar grounding conductor 23 is set to approximately 0.1 mm, and a gap between the second line conductor 24 and the second coplanar grounding conductor 25 is set to approximately 0.3 mm.

In such a high-frequency package of the invention, it is important to set a gap between the grounding metal terminals 34 placed in parallel on both the sides of the metal terminal 32 to $\lambda/2$ or less.

Figure 4:
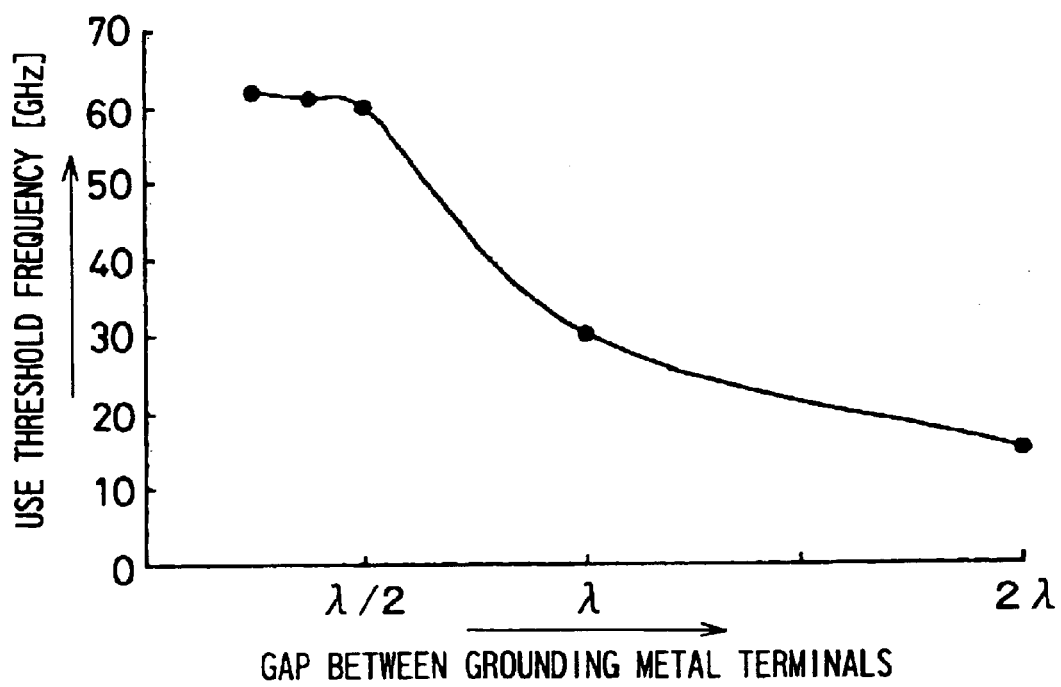
FIG. 4 is a chart showing a relation between a gap between grounding metal terminals and a use threshold frequency of high-frequency signals in the high-frequency package of the invention.

Here, in FIG. 4, a relation between a gap between the grounding metal terminals 34 and a use threshold frequency of high-frequency signals showing in FIGS. 1 to 3 will be shown by a chart. This data is the result of an examination by the use of a three-dimensional electromagnetic field simulator. A dielectric material having a dielectric constant of 6.0 and thickness of 0.4 mm was used as the dielectric substrate 21, and a dielectric material having a dielectric constant of 3.38 and thickness of 0.2 mm was used as the circuit board 31. The line width of the first line conductor 22 was set to 0.32 mm so that transmission line impedance became approximately 50 Ω. Moreover, the line width of the connecting line conductor 30 formed on the circuit board 31 was set to 0.42 mm so that transmission line impedance became approximately 50 Ω. Furthermore, the width of the metal terminal 32 was set to 0.2 mm. In FIG. 4, the horizontal axis shows a gap (unit: $n\lambda$) between the grounding metal terminals 34, and the vertical axis shows a use threshold frequency (unit: GHz). A use threshold frequency was a frequency calculated by the electromagnetic field simulator that the value of S11 (reflection characteristic) became −15 dB or less.

As shown by a characteristic curve that connects the respective results shown by dots in FIG. 4, when a gap between the grounding metal terminals 34 was changed among $\lambda/4$, $\lambda/3$, $\lambda/2$, $\lambda$ and $2\lambda$, the use critical frequencies became 62 GHz, 61 GHz, 60 GHz, 30 GHz and 15 GHz, respectively. As apparent from the above results, since, in a case where a gap between the grounding metal terminals 34 is over ½ of the wavelength $\lambda$ (i.e., $\lambda/2$) of high-frequency signals of a used frequency, when this high-frequency package is surface-mounted on the circuit board 31, a grounding state of the grounding metal terminals 34 tends to become unstable at bonding regions between the dielectric substrate 21 and the circuit board 31, characteristic impedance changes and a reflection loss is caused locally in these regions, and a shield effect of high-frequency signals becomes insufficient and a radiation loss is caused in these regions, with the result that a high-frequency signal transmission characteristic is deteriorated by these losses.

Therefore, in the high-frequency package of the invention, a gap between the grounding metal terminals 34 is placed in parallel on both the sides of the metal terminal 32 to $\lambda/2$ or less.

The metal terminal 32 and the grounding metal terminal 34 are formed into a specified shape by applying a punching process or an etching process to a plate material of iron-nickel-cobalt alloy, iron-nickel alloy or the like, for example. Moreover, for bonding the metal terminal 32 to the second line conductor 24 and the connecting line conductor 30, for example, a method of making the metal terminal 32 abut on the second line conductor 24 so as to sandwich a first brazing material such as silver-copper solder between them, and brazing the metal terminal 32 to the second line conductor 24 by heating them at a temperature of equal to or more than a melting point of the first brazing material, and thereafter, making the metal terminal 32 bonded to the second line conductor 24 abut on the connecting line conductor 30 on the upper face of the circuit board 31 so as to sandwich a second brazing material such as silver-copper solder having a lower melting point than the first brazing material between them, and brazing the metal terminal 32 to the connecting line conductor 30 by heating them at a temperature of equal to or more than the melting point of the second brazing material and equal to or less than the melting point of the first brazing material is adopted.

Further, by coating the surfaces of the metal terminal 32 and the grounding metal terminal 34 with metal such as nickel or gold that has good conductivity and excellent corrosion resistance by a plating method to thickness of 1 to 20 μm, it is possible to effectively prevent oxidation corrosion of the metal terminal 32 and the grounding metal terminal 34, and it is possible to realize good electrical connection of a signal system and a ground system. Therefore, it is preferable to coat the surfaces of the metal terminal 32 and the grounding metal terminal 34 with nickel, gold or the like by a plating method to thickness of 1 to 20 μm.

The circuit board 31 is constituted by coat-forming the connecting line conductor 30 on the upper face of the dielectric base 29, and this dielectric base 29 is made of a dielectric material such as sintered aluminum oxide, sintered aluminum nitride, sintered mullite, sintered silicon carbide, sintered silicon nitride, ceramics such as glass ceramics, or an organic resin. For example, in the case of being made of sintered aluminum oxide, it is manufactured by adding and mixing a proper organic binder, solvent, plasticizer, dispersion agent and so on to powder material of aluminum oxide, silicon oxide, calcium oxide or the like and forming slurry, forming this into a ceramic green sheet by adopting a sheet forming method such as a doctor blade method, and thereafter, applying a suitable punching process to this ceramic green sheet and firing at a temperature of approximately 1600° C. in a reduction atmosphere.

Besides, the connecting line conductor 30 is approximately 0.1 to 2.0 mm in width, the connecting line conductor 30 is made of a conductive material such as metallic metalization of tungsten, molybdenum, copper, silver or the like. For example, in a case where they are made of tungsten metalization, by print-applying or filling tungsten paste prepared by adding and mixing a proper organic binder and solvent to tungsten powder to a ceramic green sheet to become the dielectric base 29 of the circuit board 31 is previously pierced by a screen printing method in a specified pattern, and firing this together with the ceramic green sheet to become the dielectric base 29, they are adhered and formed from the upper face to the lower face of the dielectric base 29 in a specified pattern.

This embodiment shows an example that a conductive board that the grounding metal terminals 34 placed in parallel on both the sides of the metal terminal 32 and bonded to the second coplanar grounding conductor 25 are integrally formed is bonded to the second coplanar grounding conductor 25 on the lower face of the dielectric substrate 21 via an adhesive such as a brazing material. This conductive board 35 is made of metal such as iron-nickel-cobalt alloy or iron-nickel alloy. For example, in the case of being made of iron-nickel-cobalt alloy, it is formed into a specified shape by applying a metal processing method such as a rolling processing method or a punching processing method to an ingot thereof.

Furthermore, in this embodiment, a power source connecting terminal 36 is attached to the lower face of the dielectric substrate 21. This power source connecting terminal 36 is a bias terminal necessary for driving the high-frequency circuit component S, and it is brazed to a power source conductor (not shown in the drawings) on the upper face of the circuit board 31 and electrically connected to the high-frequency circuit component S mounted on the mounting portion 21a by a conductive connecting member such as a bonding wire or a ribbon in a state that a wiring conductor (not shown in the drawings) to which this power source connecting terminal 36 is connected is led out to the mounting portion 21a, thereby supplying bias electric power to the high-frequency circuit component S. By thus attaching the power source connecting terminal 36 of the same material and shape as the metal terminal 32, it is possible to finely and firmly connect the high-frequency package to the circuit board 31 by brazing by the use of the power source connecting terminal 36. Moreover, by placing the metal terminal 32 and the power source connecting terminal 36 on each side on the outer periphery of the dielectric substrate 21 as shown in this example, it is possible to mount the high-frequency package to the circuit board 31 more firmly, and it is possible to mount with higher reliability.

Figure 5:
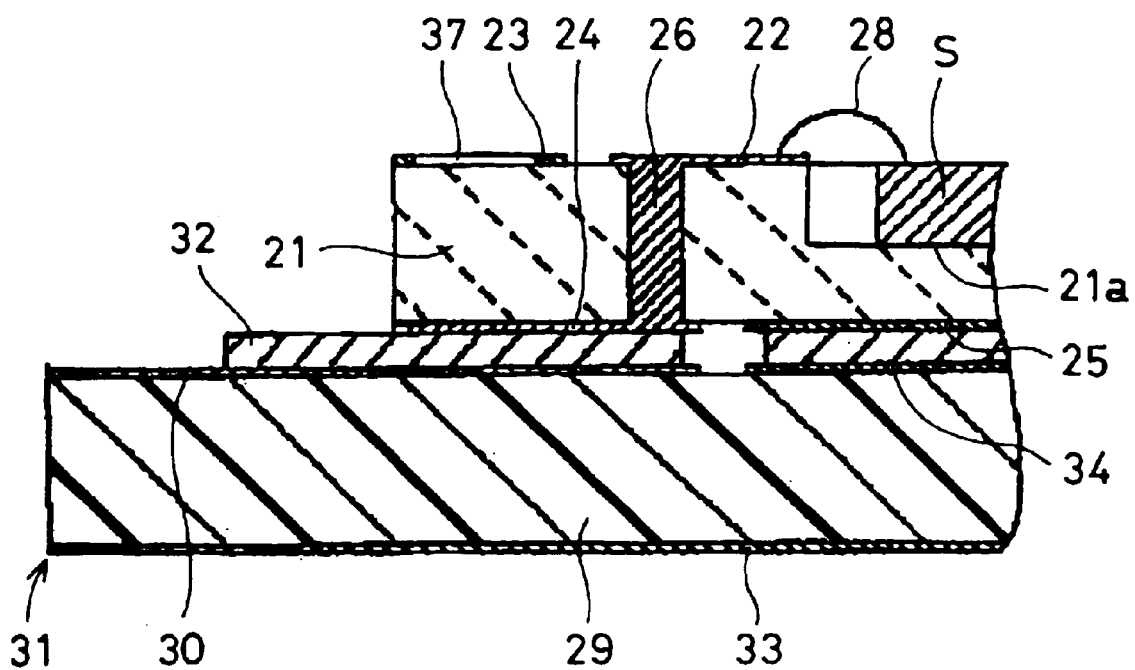
FIG. 5 is a partial sectional view showing a high-frequency package according to another embodiment of the invention.
Figure 6:
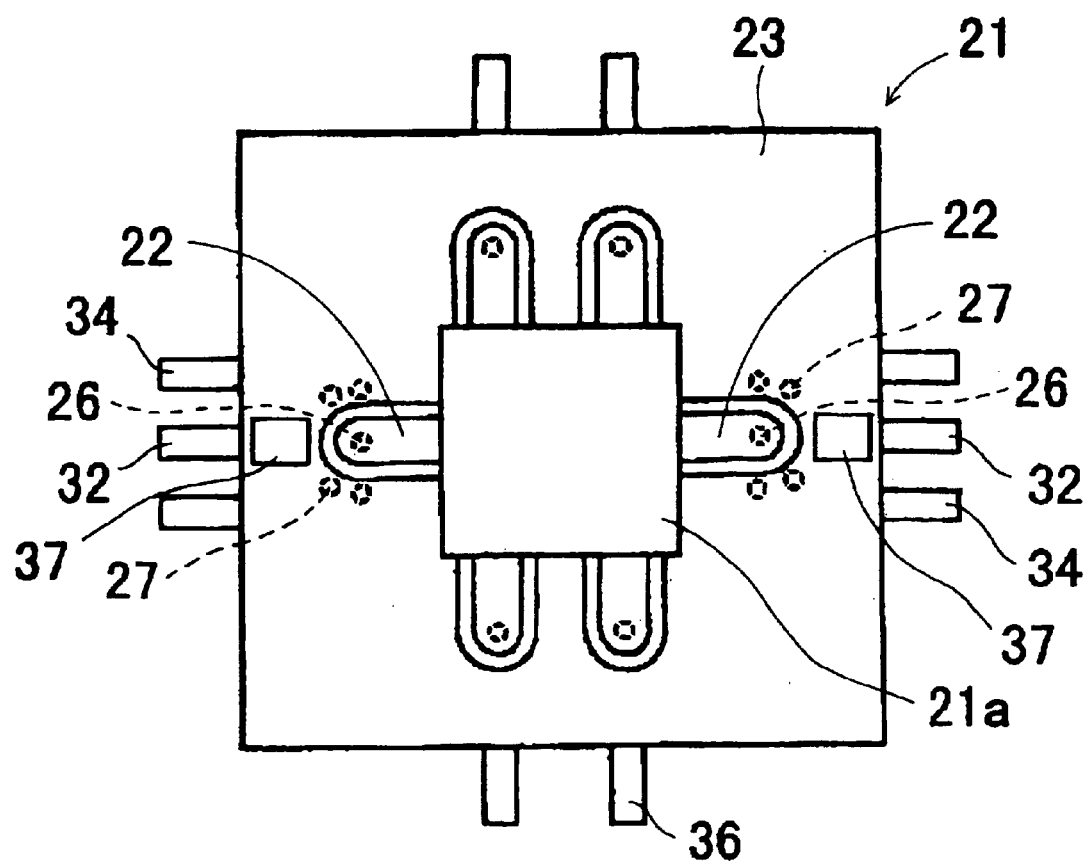
FIG. 6 is a top view showing the high-frequency package according to another embodiment of the invention.

Next, FIG. 5 is a partial sectional view showing a high-frequency package according to another embodiment of the invention in the same manner as FIG. 1. FIG. 6 is a top view showing the high-frequency package according to another embodiment of the invention in the same manner as FIG. 3. In FIG. 5, the same parts as in FIGS. 1 to 3 are denoted by the same reference numerals. In this embodiment of the high-frequency package of the invention, a conductor non-formed portion 37 is disposed on the first coplanar grounding conductor 23 in a region that locates above the metal terminal 32. That is, the conductor non-formed portion 37 is disposed on a region in the first coplanar grounding conductor 23 corresponding to a position of the metal terminal 32.

By thus disposing the conductor non-formed portion 37 in part of the first coplanar grounding conductor 23, which is a region that locates above the metal terminal 32, it is possible to decrease a capacitance component inside the dielectric substrate 21 existing between the metal terminal 32 and the first and second coplanar grounding conductors 23, 25 and a capacitance component inside the dielectric base 29 of the circuit board 31 existing between the metal terminal 32 and the lower-face-side grounding conductor 33 of the circuit board 31 at the time of surface-mounting this high-frequency package to the circuit board 31 in accordance with the size of this non-formed portion 37. Therefore, it is possible to reduce a capacitance component generated between the dielectric substrate 21 constituting the high-frequency package and the dielectric base 29 of the circuit board 31 where this package is surface-mounted. As a result, it is possible to deter high-frequency mismatching to high-frequency input/output signals at the input/output portions at the time of surface-mounting to the circuit board 31, hold down a loss of high-frequency input/output signals and lower a VSWR.

Figure 7:
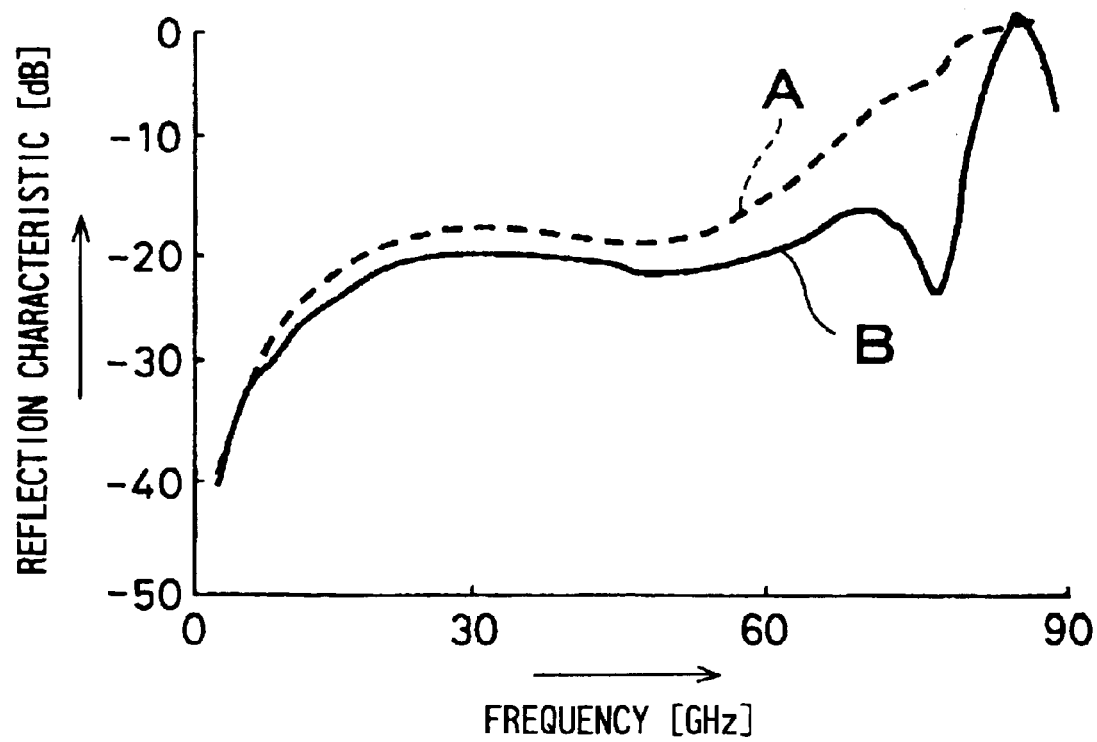
FIG. 7 is a chart showing a comparison of high-frequency characteristics depending on the presence of a non-formed portion of a first coplanar grounding conductor in the high-frequency package of the invention.

Here, in FIG. 7, the results of high-frequency characteristic simulations in a case where the grounding conductor non-formed portion 37 is disposed on the first coplanar grounding conductor 23 in a region that locates above the metal terminal 32 and in a case where not disposed in the embodiment of the high-frequency package of the invention shown in FIGS. 5 and 6 will be shown. This data is the result of an examination by the use of a three-dimensional electromagnetic field simulator. A dielectric material having a dielectric constant of 6.0 and thickness of 0.4 mm was used as the dielectric substrate 21 of the high-frequency package, and a dielectric material having a dielectric constant of 3.38 and thickness of 0.2 mm was used as the dielectric base 29 of the circuit board 31. The line width of the first line conductor 22 was set to 0.32 mm so that transmission line impedance became approximately 50 $\Omega$. Moreover, the line width of the connecting line conductor 30 formed on the circuit board 31 was set to 0.42 mm so that transmission line impedance became approximately 50 $\Omega$. Furthermore, the size of the grounding conductor non-formed portion 37 that exists above the metal terminal 32 and locates on the same plane as the first coplanar grounding conductor 23 was set to 0.7 mm×1.0 mm.

In a chart of FIG. 7, the horizontal axis shows a frequency (unit: GHz), and the vertical axis shows a reflection characteristic (unit: dB). Moreover, of characteristic curves, a dot line A shows the result in a case where the non-formed portion 37 was not disposed, and a solid line B shows the result in a case where the non-formed portion 37 was disposed. As apparent from these results, while a reflection characteristic was 15 dB up to 62 GHz in a case where the grounding conductor non-formed portion 37 was not disposed on the first coplanar grounding conductor 23 in a region that locates above the metal terminal 32 (A), a reflection characteristic was 15 dB up to 83 GHz in a case where the non-formed portion 37 was disposed (B), and a high-frequency characteristic became better in a case where the non-formed portion 37 was disposed than in a case where not disposed.

Although the boarder width the non-formed portion 37 has, the more effective it is because it is capable of more largely reducing a capacitance component generated between the dielectric substrate 21 of the high-frequency package and the dielectric base 29 of the circuit board 31, it is desirable that the line width is the same as the width between the grounding metal terminals 34 or approximately 80% or less of the width between the grounding metal terminals 34. This is because when the width of the non-formed portion 37 is too broad, a transmission characteristic of high-frequency signals tends to be deteriorated by radiation of electromagnetic waves of high-frequency signals from the non-formed portion 37.

Further, although the shape of the non-formed portion 37 is substantially rectangular in the embodiment shown in FIG. 5, in the case of such a rectangular shape, for example, in an ultrahigh-frequency band of 70 GHz or more, an electric field concentrates on the end portion of the non-formed portion 37 and a propagation mode becomes discontinuous, so that it is feared that an insertion loss increases. In this case, the non-formed portion 37 may be shaped into a circle, an oval or the like to make a structure for relieving local concentration of an electric field at the non-formed portion 37.

Figure 8:
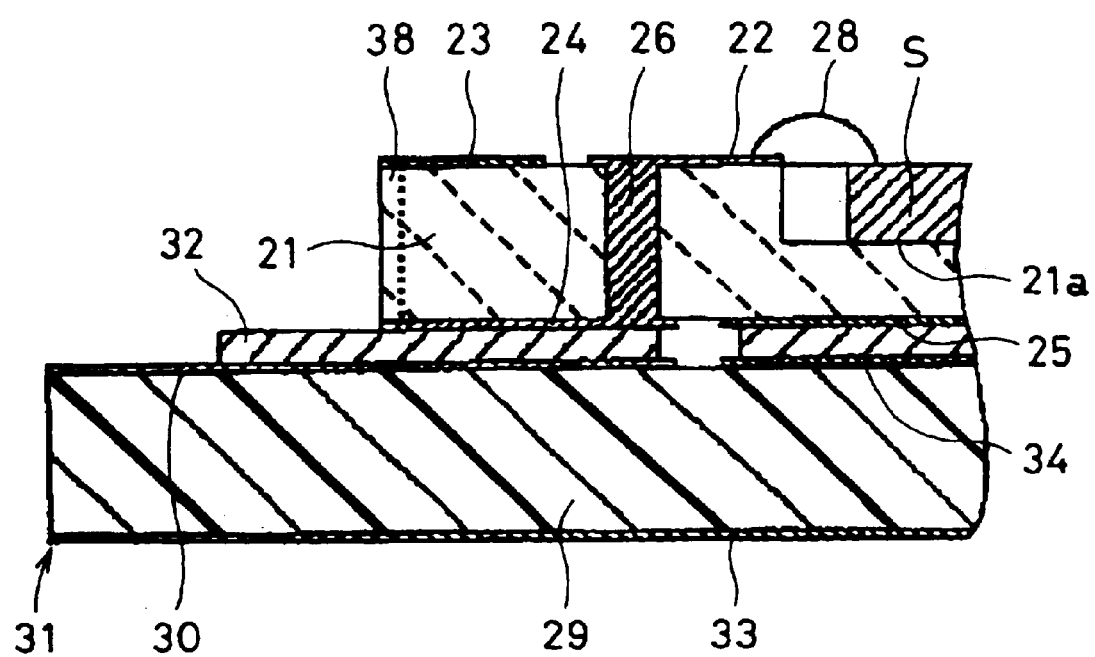
FIG. 8 is a partial sectional view showing a high-frequency package according to still another embodiment of the invention.
Figure 9:
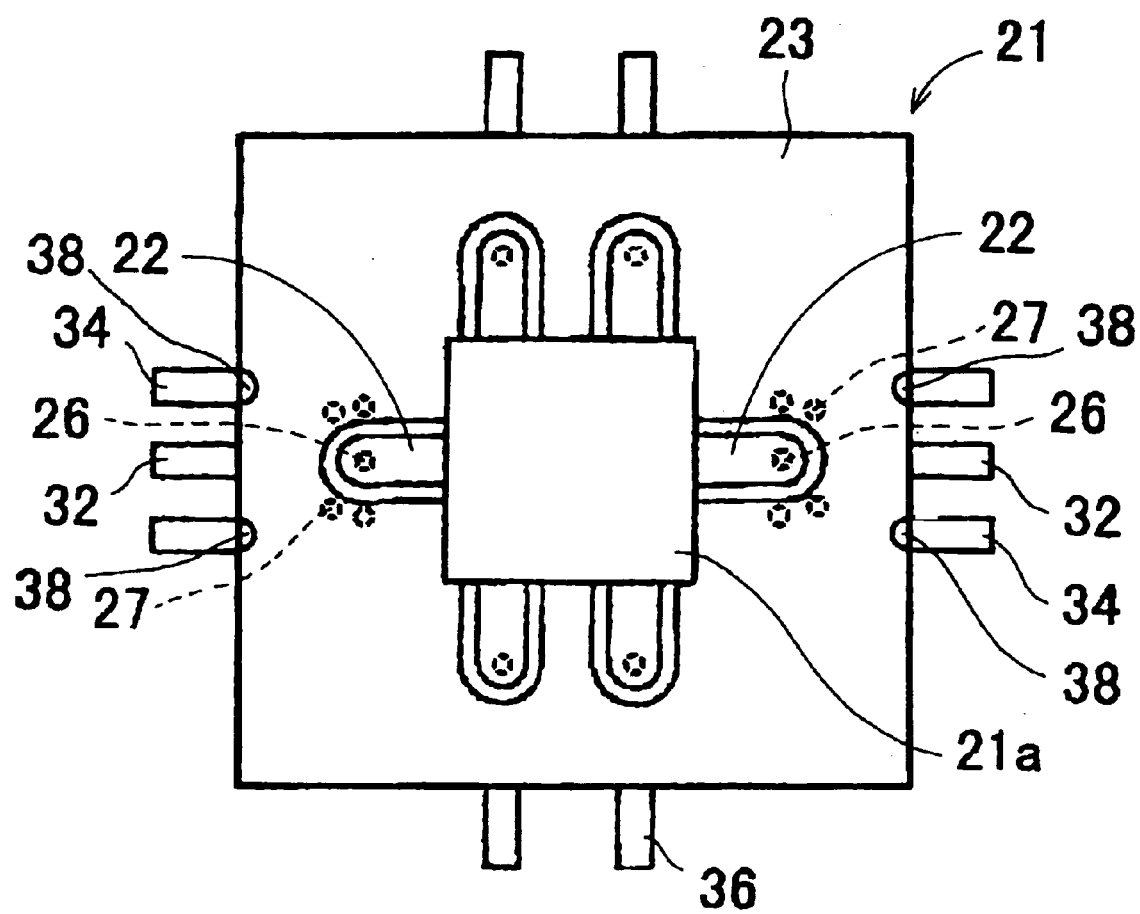
FIG. 9 is a top view showing the high-frequency package according to still another embodiment of the invention.

Next, FIG. 8 is a partial sectional view showing a high-frequency package according to still another embodiment of the invention in the same manner as FIGS. 1 and 5. FIG. 9 is a top view showing the high-frequency package according to still another embodiment of the invention in the same manner as FIGS. 3, 6. In FIGS. 8 and 9, the same parts as in FIGS. 1 to 3 and 5 to 6 are denoted by the same reference numerals. In this high-frequency package of the invention, on the side face of the dielectric substrate 21 in a region that locates on the grounding metal terminal 34, a so-called castellation grounding conductor 38 that electrically connects the first coplanar grounding conductor 23 and the grounding metal terminal 34 is disposed in a manner that the conductor is formed inside a groove-like cavity formed on the side face from the upper face to the lower face. That is, the castellation grounding conductor 38 that electrically connects the first coplanar grounding conductor 23 and the grounding metal terminal 34 is disposed on a region in the side face of the dielectric substrate 21 corresponding to a position of the grounding metal terminal 34. Consequently, since the first coplanar grounding conductor 23 and the grounding metal terminal 34 are electrically connected directly by the castellation conductor 38, a grounding state of input/output portions of high-frequency signals is stabilized, and at the input/output portions, it is possible to reduce a reflection loss of high-frequency signals, as well as it is possible to increase an electromagnetic wave shield effect and suppress a radiation loss, with the result that it is possible to hold down a loss of high-frequency input/output signals at the input/output portions of high-frequency signals and lower a VSWR, and it is possible to obtain a good high-frequency signal transmission characteristic.

Figure 10:
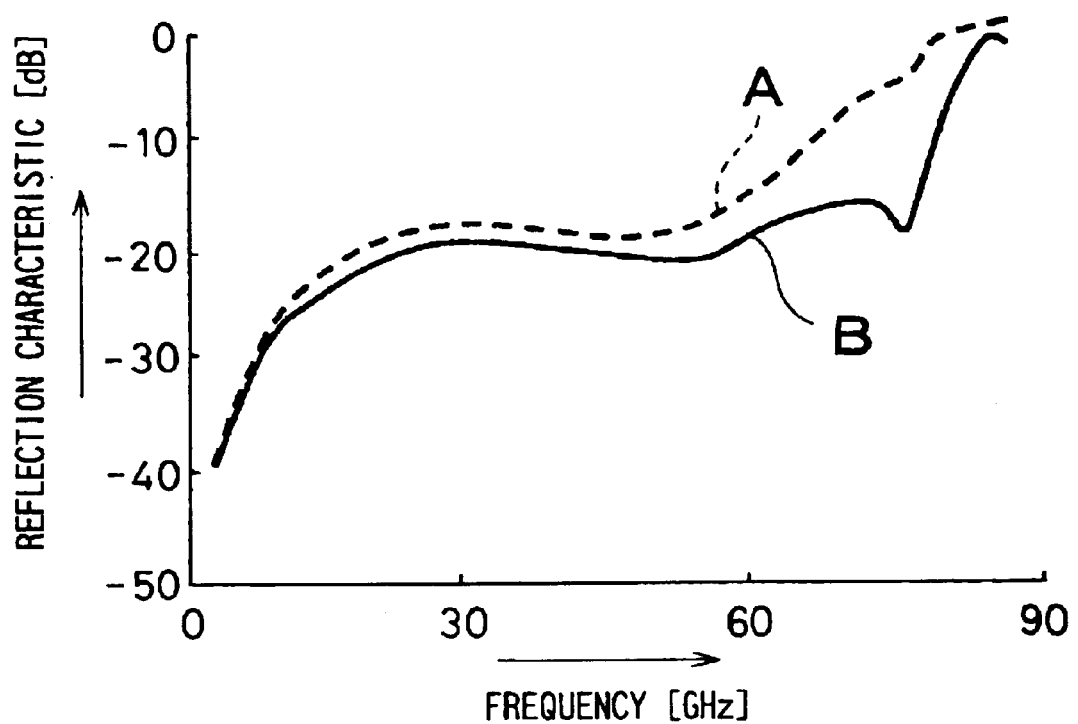
FIG. 10 is a chart showing a comparison of high-frequency characteristics depending on the presence of a castellation grounding conductor that connects a first coplanar grounding conductor and a grounding metal terminal in the high-frequency package of the invention.
Figure 11A:
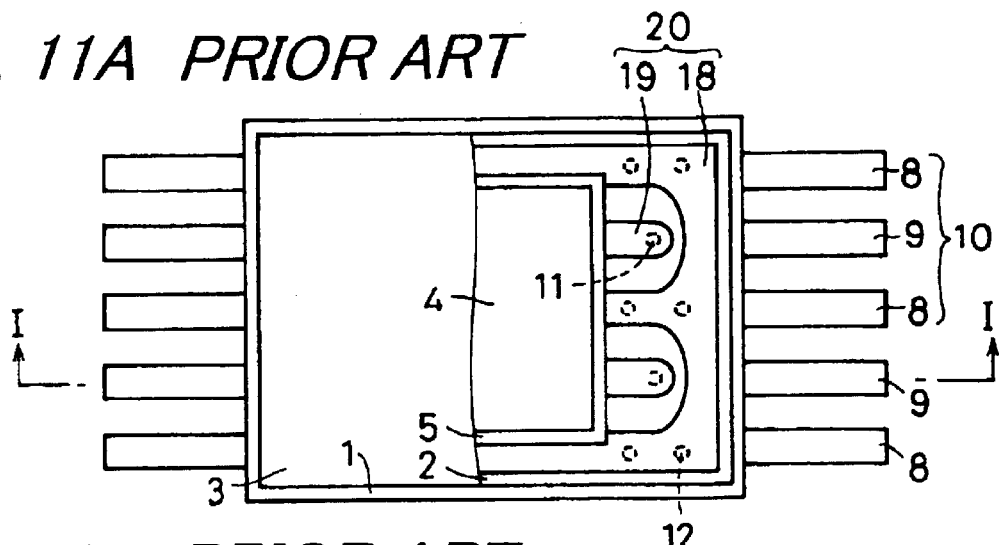
FIG. 11A is a partial plan view showing an example of a conventional high-frequency package.
Figure 11B:
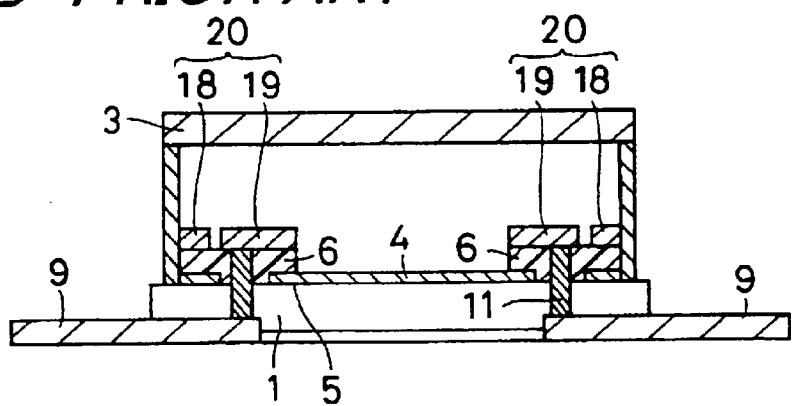
FIG. 11B is a sectional view taken on line I—I of FIG. 11A.
Figure 11C:
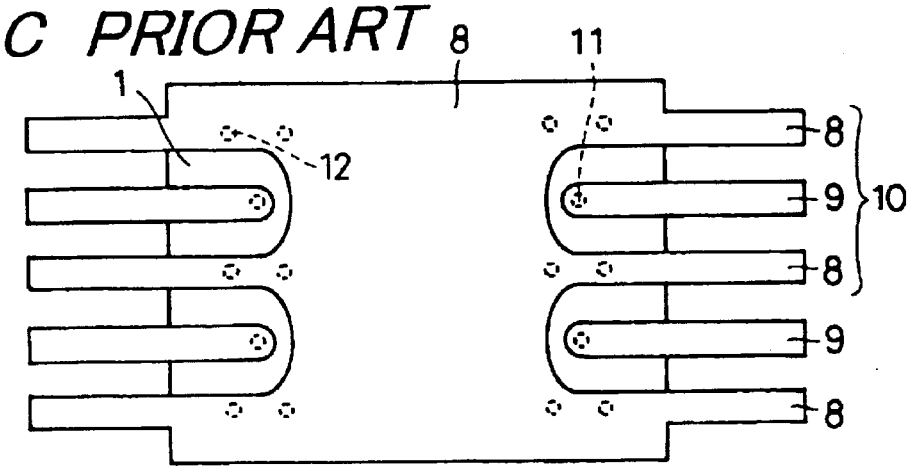
FIG. 11C is a bottom view.
Figure 12:
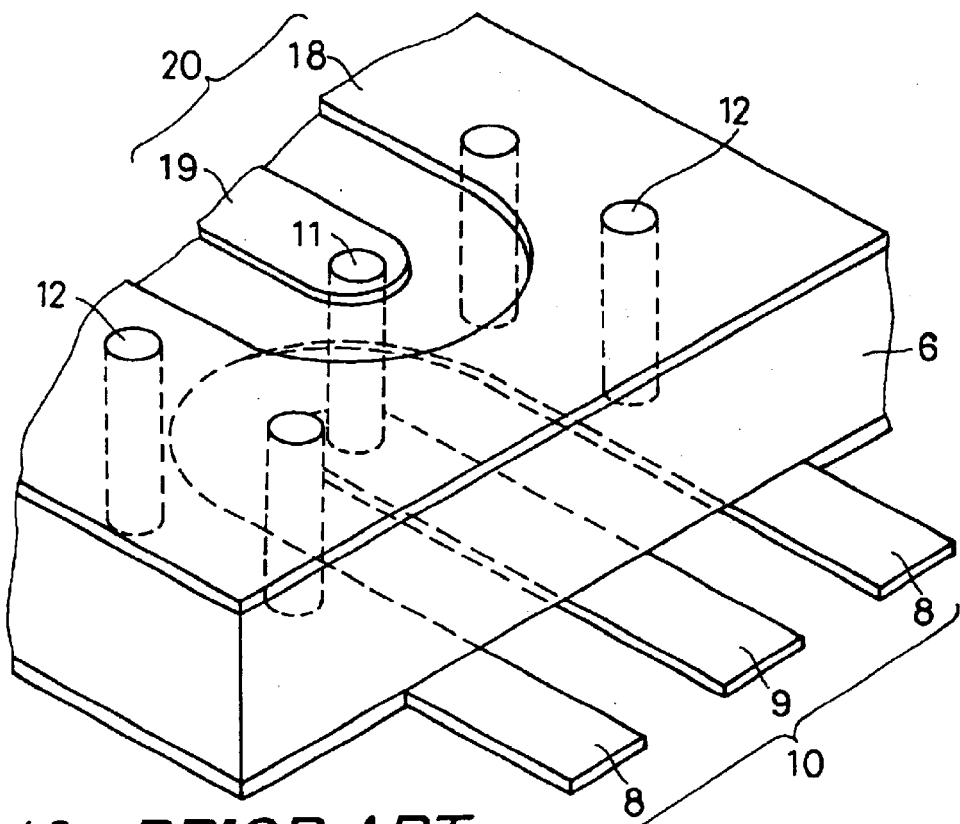
FIG. 12 is a perspective view showing an essential portion of the conventional high-frequency package shown in FIGS. 11A to 11C by magnifying.
Figure 13:
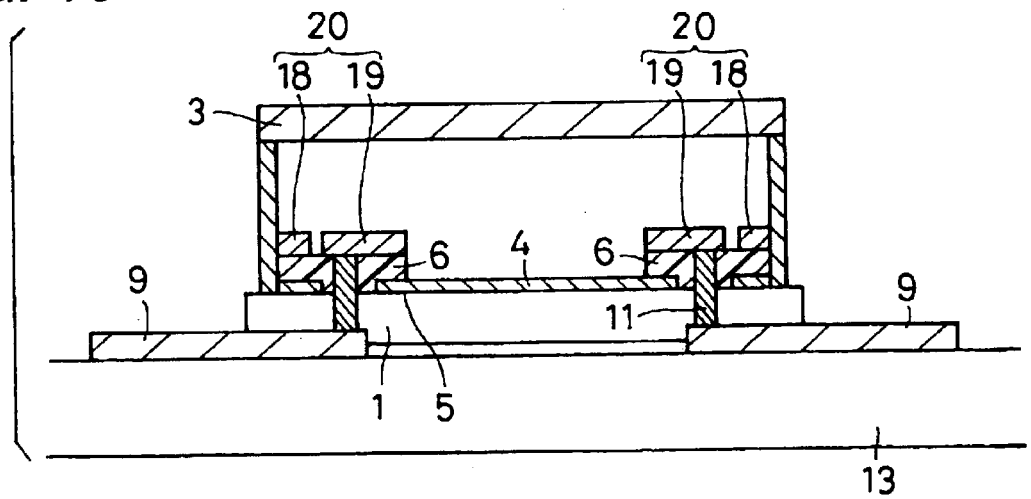
FIG. 13 is a sectional view showing a state of the conventional high-frequency package mounted on a circuit board.

Here, in FIG. 10, the results of high-frequency characteristic simulations in a case where the castellation grounding conductor 38 that electrically connects the first coplanar grounding conductor 23 and the grounding metal terminal 34 is disposed on the side face of the dielectric substrate 21 in a region that locates on the grounding metal terminal 34 and in a case where not disposed in the embodiment of the high-frequency package of the invention shown in FIG. 8 and FIG. 9 will be shown. This data is also the result of an examination by the use of a three-dimensional electromagnetic field simulator. A dielectric material having a dielectric constant of 6.0 and thickness of 0.4 mm was used as the dielectric substrate 21 of the high-frequency package, and a dielectric material having a dielectric constant of 3.38 and thickness of 0.2 mm was used as the dielectric base 29 of the circuit board 31. The line width of the first line conductor 22 was set to 0.32 mm so that transmission line impedance became approximately 50 Ω. Moreover, the line width of the connecting line conductor 30 formed on the circuit board 31 was set to 0.42 mm so that transmission line impedance became approximately 50 Ω.

In a chart of FIG. 10, the horizontal axis shows a frequency (unit: GHz), and the vertical axis shows a reflection characteristic (unit: dB). Moreover, of characteristic curves, a dot line A shows the result in a case where the castellation grounding conductor 38 that electrically connects the first coplanar grounding conductor 23 and the grounding metal terminal 34 was not disposed on the side face of the dielectric substrate 21 in a region that locates on the grounding metal terminal 34, and a solid line B shows the result in a case where the castellation grounding conductor 38 was disposed. As apparent from these results, while a reflection characteristic was 15 dB up to 62 GHz in a case where the castellation grounding conductor 38 that electrically connects the first coplanar grounding conductor 23 and the grounding metal terminal 34 was not disposed on the side face of the dielectric substrate 21 in a region that locates on the grounding metal terminal 34 (A), a reflection characteristic was 15 dB up to 82 GHz in a case where the castellation grounding conductor 38 was disposed (B), and a high-frequency characteristic became better in a case where the castellation grounding conductor 38 was disposed than in a case where not disposed.

The castellation grounding conductor 38 can be formed by the same material and method as the respective conductor layers described above in a manner that a conductor layer is formed inside a groove-like concavity formed from the upper face to the lower face of the dielectric substrate 21 on the side face of the dielectric substrate 21 in a region that locates on the grounding metal terminal 34 so as to electrically connect the first coplanar grounding conductor 23 and the grounding metal terminal 34, and moreover, may be formed by mounting another conductive member, for example, a metal plate or a metal block in this groove-like concavity. Besides, since the deeper the concavity is formed toward the central portion of the dielectric substrate 21, the longer in distance a grounding state is stabilized, it is possible to hold down a loss of high-frequency input/output signals at input/output portions and lower a VSWR, and it is possible to obtain a more excellent high-frequency signal transmission characteristic.

Thus, according to the high-frequency package of the invention, since a gap between the grounding metal terminals 34 placed in parallel on both the sides of the metal terminal 32 is λ/2 or less, a ground network path between the grounding metal terminals 34 becomes short when this high-frequency package is surface-mounted on the circuit board 31, and increase of an inductance component can be prevented. Therefore, it is possible to bring the grounding metal terminals 34 into a stable grounding state in bonding regions between the dielectric substrate 21 of the package and the circuit board 31, and it is possible to suppress a leak of high-frequency signals in these regions. As a result, according to the invention, a high-frequency package having an excellent high-frequency signal input/output characteristic that is capable of deterring high-frequency mismatching to high-frequency input/output signals and a radiation loss at input/output portions when surface-mounted on the circuit board, holding down a loss of high-frequency input/output signals and lowering a VSWR is realized.

Further, in the high-frequency package of the invention, by disposing the grounding conductor non-formed portion 37 on the first coplanar grounding conductor 23 in a region that locates above the metal terminal 32, it is possible to reduce a capacitance component inside the dielectric substrate 21 existing between the metal terminal 32 and the first and second coplanar grounding conductors 23, 25 and a capacitance component inside the dielectric base 29 of the circuit board 31 existing between the metal terminal 32 and the lower-face-side grounding conductor 33 of the circuit board 31 at the time of surface-mounting this high-frequency package on the circuit board 31 depending on the size of the non-formed portion 37. Therefore, it is possible to reduce a capacitance component generated between the dielectric substrate 21 constituting the high-frequency package and the dielectric base 29 of the circuit board 31 that this package is surface-mounted. As a result, it is possible to deter high-frequency mismatching to high-frequency input/output signals at input/output portions at the time of surface-mounting on the circuit board 31, hold down a loss of high-frequency input/output signals and lower a VSWR.

Furthermore, in the high-frequency package of the invention, since the first coplanar grounding conductor 23 and the grounding metal terminal 34 are electrically connected directly by the castellation grounding conductor 38 that electrically connects the first coplanar grounding conductor 23 and the grounding metal terminal 34 disposed on the side face of the dielectric substrate 21 in a region that locates on the grounding metal terminal 34, a grounding state at input/output portions of high-frequency signals is stabilized, and at the input/output portions, it is possible to decrease a reflection loss, as well as it is possible to increase an electromagnetic wave shield effect and suppress a radiation loss. As a result, it is possible to hold down a loss of high-frequency input/output signals at the input/output portions of high-frequency signals and lower a VSWR, and it is possible to obtain a good high-frequency signal transmission characteristic.

The invention is not limited to the embodiments described above, and can be altered in various ways in the scope of the invention. For example, although the metal terminal 32 and the grounding metal terminal 34 are made of metal such as iron-nickel-cobalt alloy or iron-nickel alloy in the above embodiments, it is needless to say that the invention can be applied also in a case where the metal terminal 32 and the grounding metal terminal 34 are terminals made of solder, copper, a brazing material or the like.

Further, regarding the metal terminal 32 and the grounding metal terminal 34 as input/output portions of high-frequency signals, a pair of input/output portions are disposed on each side that faces a region of the mounting portion 21a where the high-frequency circuit component S of a high-frequency semiconductor device or the like is mounted, whereas two or more pairs of input/output portions may be disposed on each side so as to meet a multiple port IC.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A high-frequency package comprising:
 a dielectric substrate, on one face of which a mounting portion of a high-frequency circuit component is formed;
 a first line conductor, formed on the one face of the dielectric substrate from a vicinity of the mounting portion in an outer periphery direction, for transmitting high-frequency signals;
 a first coplanar grounding conductor formed on both sides of the first line conductor on the one face of the dielectric substrate;
 a second line conductor, formed on another face of the dielectric substrate toward an outer periphery edge so that an end portion thereof faces an outer-periphery-side end portion of the first line conductor, for transmitting the high-frequency signals;
 a second coplanar grounding conductor formed on both sides of the second line conductor on the other face of dielectric substrate;
 a through conductor, formed inside the dielectric substrate, for electrically connecting the facing end portions of the first and second line conductors;
 a grounding through conductor, formed inside the dielectric substrate, for electrically connecting the first and second coplanar grounding conductors;
 a metal terminal bonded to the second line conductor in parallel; and
 grounding metal terminals bonded to the second coplanar grounding conductors on both sides of the metal terminal in parallel, respectively,
 wherein a gap between the grounding metal terminals is equal to or less than one half of a wavelength of the high-frequency signals.

2. The high-frequency package of claim 1, wherein a conductor non-formed portion is disposed on a region in the first coplanar grounding conductor corresponding to a position of the metal terminal.

3. The high-frequency package of claim 2, wherein a width of the non-formed portion is equal to a width between the grounding metal terminals.

4. The high-frequency package of claim 2, wherein a width of the non-formed portion is equal to or less than 80% of a width between the grounding metal terminals.

5. The high-frequency package of claim 2, wherein a shape of the non-formed portion is a circle or an oval.

6. The high-frequency package of claim 1, wherein the metal terminal is placed on a side of an outer periphery of the dielectric substrate.

7. The high-frequency package of claim 1, wherein a castellation grounding conductor that electrically connects the first coplanar grounding conductor and the grounding metal terminal is disposed on a region in a side face of the dielectric substrate corresponding to a position of the grounding metal terminal.

* * * * *